(12) United States Patent
Maes et al.

(10) Patent No.: US 6,329,848 B1
(45) Date of Patent: Dec. 11, 2001

(54) SAMPLE AND HOLD CIRCUITS AND METHODS

(75) Inventors: David Maes, Cupertino, CA (US); Lawrence R. Skrenes, Hartland, WI (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/560,652

(22) Filed: Apr. 27, 2000

(51) Int. Cl.[7] .................................................... G11C 27/02
(52) U.S. Cl. ............................ 327/94; 327/91; 327/534; 327/538
(58) Field of Search ................................. 327/91, 92, 93, 327/94, 95, 543–546, 390, 534–538; 341/122, 124

(56) References Cited

U.S. PATENT DOCUMENTS

| | | | |
|---|---|---|---|
| 4,308,468 | * 12/1981 | Olson | 327/94 |
| 4,542,304 | * 9/1985 | Swanson | 327/95 |
| 4,862,016 | * 8/1989 | Genrich | 327/94 |
| 5,015,877 | * 5/1991 | King | 327/94 |
| 5,084,634 | 1/1992 | Gorecki | 327/91 |
| 5,172,019 | 12/1992 | Naylor et al. | 327/390 |
| 5,324,995 | * 6/1994 | Yee | 327/91 |
| 5,422,583 | 6/1995 | Blake et al. | 327/94 |
| 5,500,612 | 3/1996 | Sauer | 327/91 |
| 5,945,872 | 8/1999 | Robertson et al. | 327/541 |

* cited by examiner

Primary Examiner—Timothy P. Callahan
Assistant Examiner—Hai L. Nguyen
(74) Attorney, Agent, or Firm—Blakely, Sokoloff, Taylor & Zafman LLP

(57) ABSTRACT

Sample and hold circuits and methods to reduce distortion. A signal to be sampled is connected across a capacitor through a field effect device, which field effect device is turned off when the sample voltage across the capacitor is to be held. When the field effect device coupling the sample voltage to the capacitor is turned on, the body and gate voltages of the field effect device are made to have a fixed voltage relative to the voltage being sampled, so that the characteristics of the field effect device are unaffected by signal variations during sampling or between samples. Exemplary embodiments are disclosed.

40 Claims, 2 Drawing Sheets

SAMPLE AND HOLD CIRCUITS AND METHODS

BACKGROUND OF THE INVENTION

1. Field of the Invention

The present invention relates to the field of sample and hold circuits.

2. Prior Art

Sample and hold circuits are well known in the prior art, being commonly used to periodically sample analog signals and hold such sample for further processing, such as the conversion of the analog sample to a digital signal. In a typical sample and hold circuit, a capacitor is first coupled to the signal to be sampled for charging to the present value of the signal, after which the capacitor is disconnected from the signal to hold the signal voltage that existed at the time of disconnection. Typical systems using sample and hold circuits are clocked systems operating at relatively high frequency on rapidly changing input signals, requiring the rapid and accurate charging of the holding capacitor while also providing a sufficiently large capacitance for adequate holding of that signal after the capacitor is disconnected from the signal being sampled.

In the prior art, CMOS transmission gates have been commonly used as a sample switch to connect and disconnect the signals being sampled to and from the sample capacitor. Such transmission gates comprise a p-channel transistor and an n-channel transistor connected in parallel so that conduction will occur through the parallel combination when either or both transistors are turned on. The gates of the transistors in turn are driven by a common signal, with one of the gates being driven through an inverter so that the common signal will drive the gates to opposite rails to tend to turn on and turn off the two transistors in unison.

Such transmission gates are simple and work well in many application. However, they have certain characteristics that limit their performance, particularly in high speed applications. For instance, when the signal being sampled is approximately midway between ground and the power supply rail, both the n-channel and the p-channel devices will be conducting. As the input increases, however, the gate-source voltage of the n-channel device reduces, tending to turn the n-channel device off, whereas the gate-source voltage of the p-channel device increases, tending to turn the p-channel device on harder. Similarly, if the input signal is below the midway point, the n-channel device will turn on harder and the p-channel device will conduct less. Since these effects are not linear, the overall resistance of the parallel combination of the two devices is a nonlinear function of the signal being sampled. Also, the source-body and the drain-body junction capacitances are non-linear, further affecting the accuracy of the resulting sample voltage. Also, the parasitic channel to gate capacitance changes with input signal, increasing or decreasing the charging current flowing through the input resistor network to the channel capacitances. The net effect of these factors is a distortion in the sample voltage verses input voltage, which distortion increases as the source impedance of the input signal increases.

BRIEF SUMMARY OF THE INVENTION

Sample and hold circuits and methods to reduce distortion are disclosed. A signal to be sampled is connected across a capacitor through a field effect device, which field effect device is turned off when the sample voltage across the capacitor is to be held. When the field effect device coupling the sample voltage to the capacitor is turned on, the body and gate voltages of the field effect device are made to have a fixed voltage relative to the voltage being sampled, so that the characteristics of the field effect device are unaffected by signal variations during sampling or between samples. Exemplary embodiments are disclosed.

DETAILED DESCRIPTION OF THE INVENTION

Figure 1:
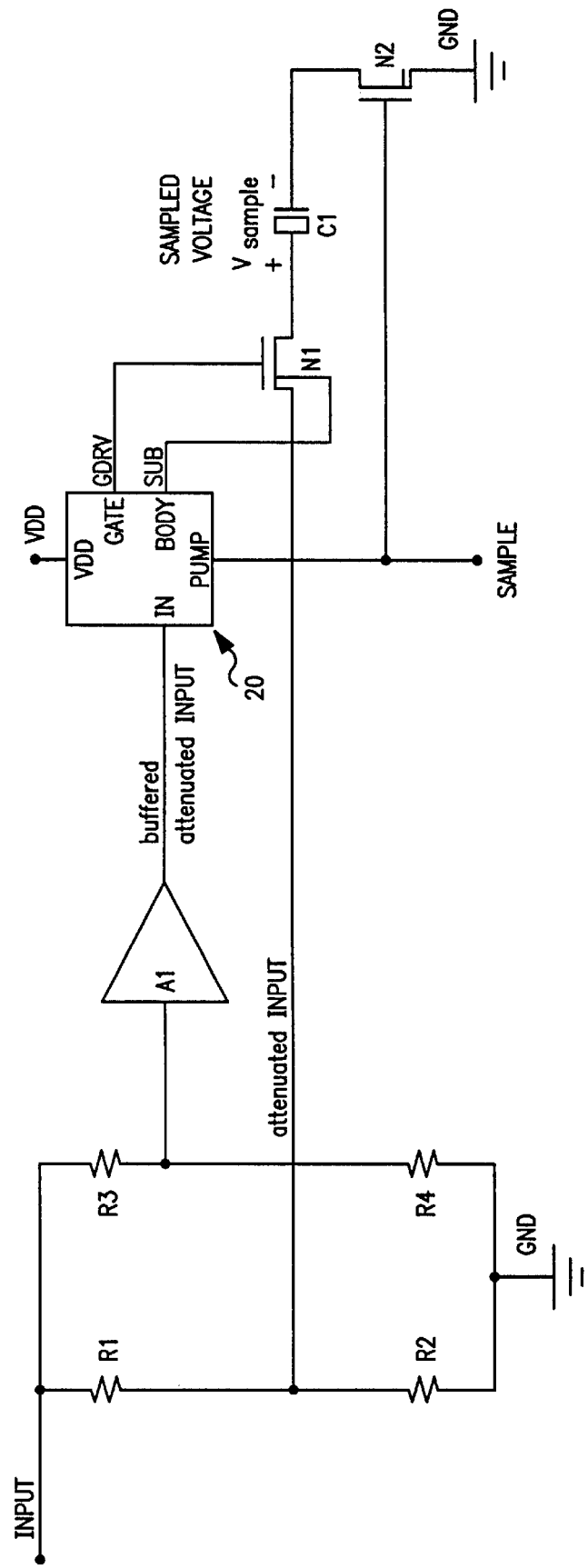
FIG. 1 is a diagram illustrating the general principles of certain embodiments of the present invention.

First referring to FIG. 1, a block diagram illustrating a sampling circuit in accordance with the present invention may be seen. As shown in the Figure, the INPUT signal to be sampled is attenuated by resistors R1 and R2 to provide an attenuated INPUT signal for sampling purposes. This attenuated voltage is sampled on capacitor Cl through two NMOS switches N1 and N2. In a typical sample and hold application, the attenuated input voltage is retained on capacitor C1 when transistors N1 and N2 are both turned off.

As may also be seen in FIG. 1, a replica input attenuator comprised of resistors R3 and R4 provides a replica attenuated INPUT signal to a buffer amplifier A1. Preferably, the ratio of resistances for resistors R3 and R4 is the same as the ratio of resistances for resistors R1 and R2, though to avoid significant loading on the input signal, resistor R3 may be k times resistor R1 and resistor R4 may be k times resistor R2, where k is preferably much greater than 1.

The output of the buffer Al is a buffered signal which is substantially equal to the attenuated INPUT signal, essentially a buffered replica of the attenuated INPUT signal. This signal is provided to a control circuit, generally indicated by the numeral 20. The control circuit, as well as transistor N2, is responsive to a SAMPLE signal which when high, turns on transistor N2 and also causes the control circuit 20 to turn on transistor N1.

In a typical circuit, CMOS transistors function as three terminal devices, with the gate voltage of each device determining the conduction between source and drain of the device. In the cage of n-channel devices, the local substrates in which the devices are formed are normally connected to the lower power supply voltage. Similarly the local substrates for p-channel devices are normally connected to the higher power supply voltage, in each case to avoid forward biasing of the p-n junction between the local substrate and the respective source and drain regions. In the case of n-channel devices or p-channel devices, the local substrate could be part of the overall substrate, or in the case of n-channel devices and/or p-channel devices, the local substrate can be a semiconductor region electrically isolated from other regions of the substrate so that the voltage of the local substrate may be controlled and varied as desired as a fourth terminal of the MOS device. Such local substrates are generally referred to herein as the body of the MOS device or field effect transistor, as is well known in the art.

Referring again to FIG. 1, the body of n-channel transistor N2 is connected to the lower power supply voltage, namely the circuit ground, as is quite common in MOS circuits. The body of transistor N1 however, as well as its gate, is connected to the control circuit 20, so that both may be controlled by the control circuit. When the SAMPLE signal is low, transistor N2 will be off, and the control circuit 20 holds the gate of transistor N1 low to also hold that transistor off. When the SAMPLE signal is high, transistor N2 is turned on. At the same time, control circuit 20 drives the body of transistor N1 to a fixed voltage relative to the output of buffer amplifier A1, the replicated attenuated INPUT voltage, and drives the gate of transistor N1 to another fixed voltage relative to the output of the buffer amplifier A1, the later fixed voltage relative to the output of the buffer amplifier A1 being a voltage to turn on transistor N1. In this way, the source to body voltage and the source to gate voltage of transistor N1 are both made independent of the attenuated INPUT, so that the conduction characteristics of transistor N1 when turned on for sampling purposes is substantially independent of the value of the attenuated INPUT voltage. In a preferred embodiment to be described with respect to FIG. 2, the control circuit 20 drives the body of transistor N1 to the replicated attenuated INPUT voltage and drives the gate of transistor N1 to VDD plus the replicated attenuated INPUT voltage, the later assuring that transistor N1 is strongly turned on during sampling.

Controlling the body and gate voltages of transistor N1 in the manner described minimizes distortion in various ways. In particular, bootstrapping the gate in the manner described keeps the gate to source voltage, and thus the channel resistance of the field effect transistor, approximately constant independent of the input voltage, minimizing distortion caused by capacitor charging current flowing through a non-linear switch resistance. Modulating the body of the field effect transistor by the input voltage eliminates threshold voltage changes due to changes in source to body and drain to body voltages. The effect of the non-linear source to body and drain to body junction capacitances is minimized by keeping the voltage across those junctions near zero volts, independent of the input voltage. Using a single, always on MOS transistor rather than a CMOS transmission gate consisting of parallel connected n-channel and p-channel field effect transistors prevents distortion caused by the n-channel and p-channel field effect transistors turning on and off as a function of the INPUT voltage. As the field effect transistors in a prior art CMOS transmission gate implementation change modes from off to on, the parasitic channel to gate capacitance changes, increasing or decreasing the charging current flowing through the input resistor network to the channel capacitances. This distortion increases as the input resistance increases.

The replica input attenuator of resistors R3 and R4 and the buffer amplifier A1 in combination drive the control circuit 20 to prevent the control circuit from causing additional distortion at the output of the main attenuator. However if desired, the buffer amplifier A1 and/or the control circuit 20 may be driven directly from the attenuated input, or directly from an un-attenuated input if the same has an appropriate voltage swing, provided that the buffer amplifier A1 and/or the control circuit 20 has a sufficiently high input impedance so as to not affect the voltage being sampled by capacitor C1. In the embodiment shown, the larger resistances for resistors R3 and R4 than for resistors R1 and R2 prevent the replica network from excessively loading the input, though require buffering from the control circuit providing the gate and body drive responsive to the sample signal. In another embodiment, the body of transistor N1 is connected to a fixed voltage, such as the circuit ground, rather than a voltage fixed with respect to the voltage being sampled. Even in this embodiment, the driving of the gate of transistor N1 by a buffered replica signal rather than the signal being sampled avoids distortion of the samples by the input characteristics of the buffer amplifier.

Figure 2:
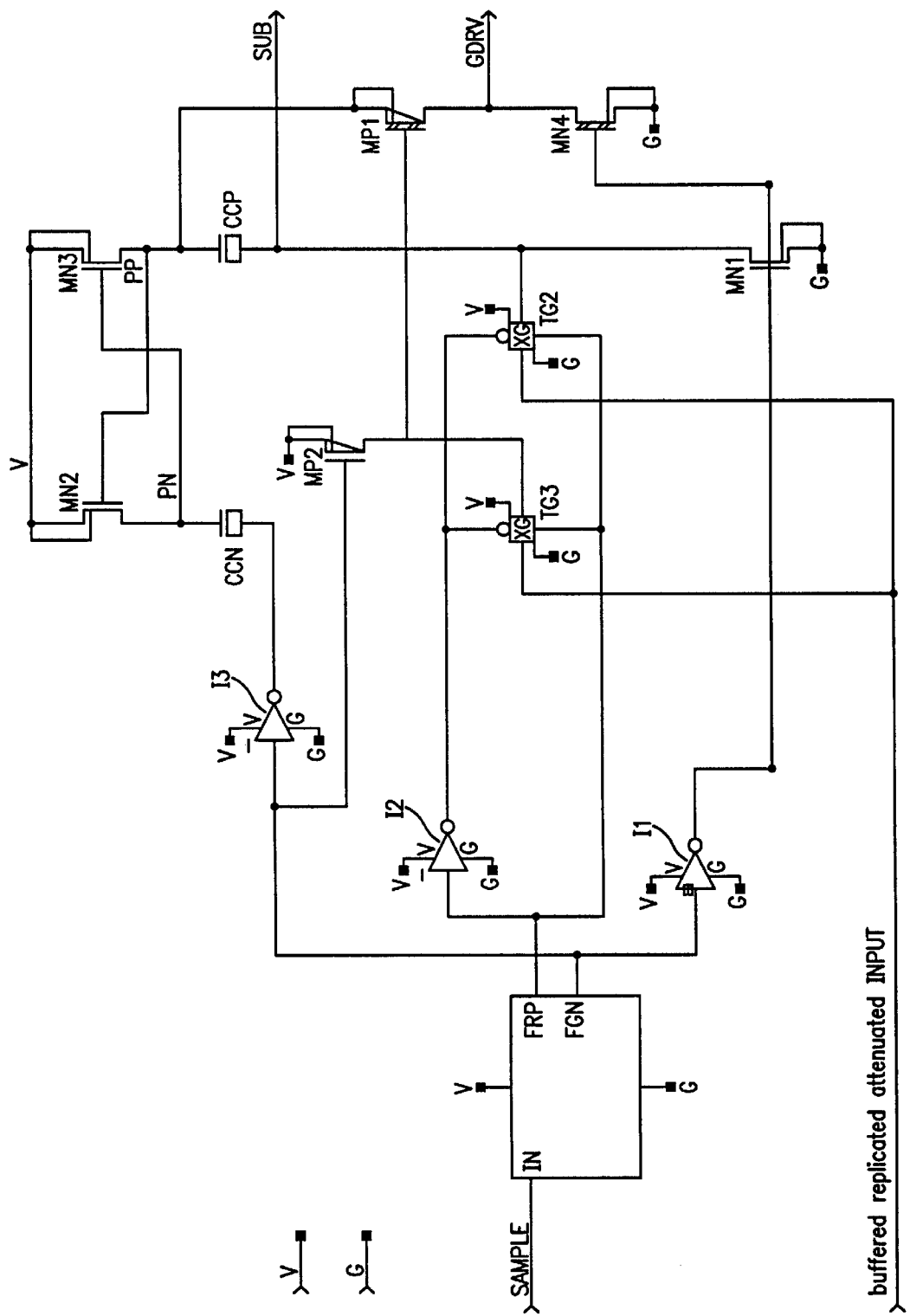
FIG. 2 is a diagram illustrating the control circuit 20 of the embodiment of FIG. 1.

Now referring to FIG. 2, a circuit diagram for an exemplary control circuit 20 may be seen. In this diagram, the drive control circuit 22 is responsive to the SAMPLE signal (essentially a sample/hold signal) to generate two logic signals, namely the FRP signal and a FGN signal, which control the circuit connected thereto. In normal operation, the signal FGN may be high or low, as may the signal FRP, though the signal FRP may not be high unless the signal FGN is also high.

When the SAMPLE signal is low, both the signals FRP and FGN are low. With the signal FRP low, the output of inverter I2 will be high, so that the CMOS transmission gates TG2 and TG3 will be off. Thus the buffer replicated attenuated INPUT signal is disconnected from the rest of the control circuit. With the signal FGN low, the output of inverter I1 will be high, turning on n-channel transistors MN1 and MN4. The low value of the signal FGN will also turn on transistor MP2 and drive the output of inverter I3 high, providing a high pulse at node PN through capacitor CCN to turn on transistor MN3, transistors MN3 and MN2 being connected as a flip flop so that transistor MN2 will turn off. Thus with both transistors MN1 and MN3 turned on, capacitor CCP will be charged to VDD. Also with transistor MP2 turned on, transistor MP1 will be turned off. Consequently both the body voltage SUB and the gate drive voltage GDRV will be at the circuit ground potential. In that regard, this local circuit ground may or may not be the same ground as in the rest of the system in which the circuit is used.

When the SAMPLE signal goes high, the signal FGN will go high. Now the output of inverter I1 will go low, turning off transistors MN1 and MN4. At the same time, the high value of the signal FGN will turn off transistor MP2 and drive the output of inverter I3 low, pulsing node PN low to turn off transistor MN3 and to turn on transistor MN2. Preferably immediately after the signal FGN goes high, the signal FRP will also go high, turning on the CMOS transmission gates TG2 and TG3. Transmission gate TG2 couples the buffered replicated attenuated INPUT signal to provide the body voltage SUB equal to that input. Because capacitor CCP is charged to VDD, the voltage on node PP will jump to the buffered replicated attenuated INPUT voltage plus VDD. At the same time, the output of CMOS transmission gate TG3 will turn on p-channel transistor MP1 to couple the voltage at node PP to the gate drive signal GDRV driving the gate of transistor N1 of FIG. 1. When the SAMPLE signal goes low again, the signal FRP is first driven low, after which the signal FGN is driven low, with the sample taken being held on the capacitor C1. Therefore preferably the signal FRP is substantially coincident with, but contained within the signal FGN. Thus, the circuit shown in FIG. 2 acts as a boot strapped charge pump, driving the body of transistor N1 of FIG. 1 to a voltage equal to the attenuated INPUT voltage FIG. 1) and driving the gate of transistor N1 of FIG. 1 to the attenuated INPUT voltage plus VDD, assuring adequate gate drive to properly turn on the transistors, and to turn on the transistor N1 to an extent that is independent of the actual signal being sampled.

In the embodiment just described, the sampling capacitor C1 may be coupled across the attenuated input signal during sampling and entirely disconnected from the circuit by turning off both transistors N1 and N2 (FIG. 1). In some applications, one end of the sampling capacitor C1 may be permanently connected in circuit, such as being permanently connected to the circuit ground potential or some other fixed circuit reference, in which case transistor N2 would be eliminated. Also in the embodiment previously disclosed, the body and the gate of transistor N1 are held at the circuit ground potential when the attenuated input signal is not being sampled. In another embodiment, the gate and body of transistor N1 may be driven to some other voltage or voltages between sampling times, subject however to the limitations that transistor N1 should be fully off between sampling times, and that forward biasing of the drain/body pn junction must be avoided to preserve the integrity of a sample. Accordingly, on the assumption that the input signal will not go below circuit ground, driving the gate and body of transistor N1 to circuit ground when that sampling is a convenient expedient for holding the transistor off and avoiding the possibility of forward biasing the drain/body junction. Also of course, while the exemplary embodiments described herein have used NMOS devices for taking samples referenced to the circuit ground, devices of the opposite conductivity could be used for the taking of samples referenced instead to the higher circuit voltage. Thus, while certain preferred embodiments of the present invention have been disclosed and described herein, it should be understood by those skilled in the art that various changes in form and detail made therein without departing from the spirit and scope of the invention.

What is claimed is:

1. A sampling circuit for sampling a varying input signal comprising:

a capacitor having first and second capacitor leads;

a MOS transistor having a body with a source, a drain and a gate;

the first capacitor lead being coupled to a fixed circuit voltage during sampling of the input signal;

the drain of the MOS transistor being coupled to the second lead of the capacitor;

the source of the MOS transistor being coupled to the input signal;

the gate and body of the MOS transistor being coupled to a control circuit, the control circuit also being coupled to a voltage equal to the voltage of the input signal;

during the taking of each of multiple samples of the input signal, the control circuit holding the gate and body of the MOS transistor at voltages which are fixed at the same predetermined values relative to the input signal for all of the multiple samples of the input signal.

2. The sampling circuit of claim 1 wherein during sampling of the input signal, the control circuit holds the body of the MOS transistor at a voltage substantially equal to the voltage of the input signal.

3. The sampling circuit of claim 1 wherein the first capacitor lead is coupled to a circuit ground voltage during sampling of the input signal.

4. The sampling circuit of claim 1 wherein the first capacitor lead is coupled to a fixed circuit voltage through a second MOS transistor, the second MOS transistor being turned on during sampling of the input signal.

5. The sampling circuit of claim 4 wherein the fixed circuit voltage is a circuit ground voltage.

6. The sampling circuit of claim 1 wherein the input signal to be sampled is derived from a second input signal as attenuated by a first attenuator.

7. The sampling circuit of claim 6 wherein the control circuit is coupled to a replica attenuator replicating the signal to be sampled.

8. A sampling circuit for sampling a varying input signal comprising:

a capacitor having first and second capacitor leads;

a MOS transistor having a body, first and second terminals and a gate controlling conduction between the first and second terminals;

the first capacitor lead being coupled to a fixed circuit voltage during sampling of the input signal;

the first terminal of the MOS transistor being coupled to the second lead of the capacitor;

the second terminal of the MOS transistor being coupled to the input signal;

the gate and body of the MOS transistor being coupled to a control circuit, the control circuit also being coupled to a voltage equal to the voltage of the input signal;

during the taking of each of multiple samples of the input signal, the control circuit holding the gate and body of the MOS transistor at voltages which are fixed at the same predetermined values relative to the input signal for all of the multiple samples of the input signal.

9. The sampling circuit of claim 8 wherein during sampling of the input signal, the control circuit holds the body of the MOS transistor at a voltage substantially equal to the voltage of the input signal.

10. The sampling circuit of claim 8 wherein the first capacitor lead is coupled to a circuit ground voltage during sampling of the input signal.

11. The sampling circuit of claim 8 wherein the first capacitor lead is coupled to a fixed circuit voltage through a second MOS transistor, the second MOS transistor being turned on during sampling of the input signal.

12. The sampling circuit of claim 11 wherein the fixed circuit voltage is a circuit ground voltage.

13. The sampling circuit of claim 8 wherein the input signal to be sampled is derived from a second input signal as attenuated by a first attenuator.

14. The sampling circuit of claim 13 wherein the control circuit is coupled to a replica attenuator replicating the signal to be sampled.

15. A method of sampling a varying input signal comprising:

providing a capacitor having first and second capacitor leads;

coupling the first capacitor lead to a fixed circuit voltage during sampling of the input signal;

coupling the second lead of the capacitor to the input signal through a MOS transistor during sampling of the input signal;

holding the gate and body of the MOO transistor at the same predetermined voltages relative to the input signal during the taking of multiple samples of the input signal.

16. The method of claim 15 wherein during sampling of the input signal, the body of the MOS transistor is held at a voltage substantially equal to the voltage of the input signal.

17. The method of claim 15 wherein the first capacitor lead is coupled to a circuit ground voltage during sampling of the input signal.

18. The method of claim 15 wherein the first capacitor lead is coupled to a fixed circuit voltage through a second MOS transistor, the second MOS transistor being turned on during sampling of the input signal.

19. The method of claim 18 wherein the fixed circuit voltage is a circuit ground voltage.

20. The method of claim 15 wherein the input signal to be sampled is derived from a second input signal by the attenuation of the second input signal by a first attenuator.

21. A sampling circuit for sampling a varying input signal comprising:
   a capacitor having first and second capacitor leads;
   a MOS transistor having a body with a source, a drain and a gate;
   the first capacitor lead being coupled to a fixed circuit voltage during sampling of the input signal;
   the drain of the MOS transistor being coupled to the second lead of the capacitor;
   the source of the MOS transistor being coupled to the input signal;
   the gate and body of the MOS transistor being coupled to a control circuit means, the control circuit means also being coupled to a voltage equal to the voltage of the input signal;
   during the taking of each of multiple samples of the input signal, the control circuit means being a means for holding the gate and body of the MOS transistor at voltages which are fixed at the same predetermined values relative to the input signal for all of the multiple samples of the input signal.

22. The sampling circuit of claim 21 wherein during sampling of the input signal, the control circuit means holds the body of the MOS transistor at a voltage substantially equal to the voltage of the input signal.

23. The sampling circuit of claim 21 wherein the first capacitor lead is coupled to a circuit ground voltage during sampling of the input signal.

24. The sampling circuit of claim 21 wherein the first capacitor lead is coupled to a fixed circuit voltage through a second MOS transistor, the second MOS transistor being turned on during sampling of the input signal.

25. The sampling circuit of claim 24 wherein the fixed circuit voltage is a circuit ground voltage.

26. The sampling circuit of claim 21 wherein the input signal to be sampled is derived from a second input signal as attenuated by a first attenuator.

27. The sampling circuit of claim 26 wherein the control circuit means is coupled to a replica attenuator replicating the signal to be sampled.

28. A sampling circuit for sampling a varying input signal comprising:
   a capacitor having first and second capacitor leads;
   a MOS transistor having a body, first and second terminals and a gate controlling conduction between the first and second terminals;
   the first capacitor lead being coupled to a fixed circuit voltage during sampling of the input signal;
   the first terminal of the MOS transistor being coupled to the second lead of the capacitor;
   the second terminal of the MOS transistor being coupled to the input signal;
   the gate and body of the MOS transistor being coupled to a control circuit means, the control circuit means also being coupled to a voltage equal to the voltage of the input signal;
   during the taking of each of multiple samples of the input signal, the control circuit means being a means for holding the gate and body of the MOS transistor at voltages which are fixed at the same predetermined values relative to the input signal for all of the multiple samples of the input signal.

29. The sampling circuit of claim 28 wherein during sampling of the input signal, the control circuit means holds the body of the MOS transistor at a voltage substantially equal to the voltage of the input signal.

30. The sampling circuit of claim 28 wherein the first capacitor lead is coupled to a circuit ground voltage during sampling of the input signal.

31. The sampling circuit of claim 28 wherein the first capacitor lead is coupled to a fixed circuit voltage through a second MOS transistor, the second MOS transistor being turned on during sampling of the input signal.

32. The sampling circuit of claim 31 wherein the fixed circuit voltage is a circuit ground voltage.

33. The sampling circuit of claim 28 wherein the input signal to be sampled is derived from a second input signal as attenuated by a first attenuator.

34. The sampling circuit of claim 33 wherein the control circuit means is coupled to a replica attenuator replicating the signal to be sampled.

35. A method of sampling a varying input signal comprising the steps of:
   providing a capacitor having first and second capacitor leads;
   coupling the first capacitor lead to a fixed circuit voltage during sampling of the input signal;
   coupling the second lead of the capacitor to the input signal through a MOS transistor during sampling of the input signal;
   holding the gate and body of the MOS transistor at the same predetermined voltages relative to the input signal during the taking of multiple samples of the input signal.

36. The method of claim 35 wherein during sampling of the input signal, the body of the MOS transistor is held at a voltage substantially equal to the voltage of the input signal.

37. The method of claim 35 wherein the first capacitor lead is coupled to a circuit ground voltage during sampling of the input signal.

38. The method of claim 35 wherein the first capacitor lead is coupled to a fixed circuit voltage through a second MOS transistor, the second MOS transistor being turned on during sampling of the input signal.

39. The method of claim 38 wherein the fixed circuit voltage is a circuit ground voltage.

40. The method of claim 35 wherein the input signal to be sampled is derived from a second input signal by the attenuation of the second input signal by a first attenuator.

* * * * *